US006806772B2

United States Patent
Glaser et al.

(10) Patent No.: US 6,806,772 B2
(45) Date of Patent: Oct. 19, 2004

(54) POWER TRANSISTOR ARRAY TEMPERATURE CONTROL SYSTEM

(75) Inventors: Jerome I. Glaser, Los Angeles, CA (US); Raymond Hann, San Bernadino, CA (US); Makoto Igawa, Van Nuys, CA (US)

(73) Assignee: ITT Manufacturing Enterprises, Inc., Wilmington, MD (US)

( * ) Notice: Subject to any disclaimer, the term of this patent is extended or adjusted under 35 U.S.C. 154(b) by 1 day.

(21) Appl. No.: 10/289,720

(22) Filed: Nov. 6, 2002

(65) Prior Publication Data

US 2004/0085131 A1 May 6, 2004

(51) Int. Cl.[7] .............................................. H03F 3/04
(52) U.S. Cl. ...................................... 330/289; 330/295
(58) Field of Search .............................. 330/256, 266, 330/272, 289, 295, 124 R

(56) References Cited

U.S. PATENT DOCUMENTS

| | | | |
|---|---|---|---|
| 5,349,336 A | | 9/1994 | Nishiura et al. |
| 5,401,099 A | | 3/1995 | Nishizawa et al. |
| 5,451,907 A | * | 9/1995 | Keane et al. ............... 330/289 |
| 5,736,769 A | | 4/1998 | Nishiura et al. |
| 5,789,502 A | | 8/1998 | Shamshoum et al. |
| 5,949,121 A | | 9/1999 | Qualich et al. |
| 5,982,221 A | | 11/1999 | Tuthill |
| 5,994,752 A | | 11/1999 | Sander et al. |
| 5,997,174 A | | 12/1999 | Wyland |
| 6,046,492 A | | 4/2000 | Machida et al. |
| 6,112,525 A | | 9/2000 | Yoshida et al. |
| 6,133,616 A | | 10/2000 | Sobhani et al. |
| 6,144,246 A | | 11/2000 | Wachter |
| 6,149,299 A | | 11/2000 | Aslan et al. |
| 6,154,087 A | | 11/2000 | Ito |
| 6,160,305 A | | 12/2000 | Sanchez |
| 6,194,968 B1 | * | 2/2001 | Winslow ..................... 330/289 |
| 6,480,061 B2 | * | 11/2002 | Dolman et al. ............. 330/289 |

FOREIGN PATENT DOCUMENTS

| | | |
|---|---|---|
| EP | 0 565 807 A1 | 10/1993 |
| WO | WO 99/12010 | 3/1999 |

* cited by examiner

*Primary Examiner*—Khanh Van Nguyen
(74) *Attorney, Agent, or Firm*—Freilich, Hornbaker & Rosen

(57) ABSTRACT

A method and apparatus for use with a transistor array for enhancing the array's performance and/or reliability and/or longevity by sensing the temperature of each transistor in the array and initiating corrective action to maintain its temperature within a desired operating range. Each array transistor has a temperature sensor closely thermally coupled thereto preferably mounted within the transistor package, in close physical proximity to the transistor junction.

13 Claims, 3 Drawing Sheets

POWER TRANSISTOR ARRAY TEMPERATURE CONTROL SYSTEM

FIELD OF THE INVENTION

This invention relates generally to electronic systems, e.g., communications, radar, etc., which employ a plurality of radio frequency (RF) power transistors and more particularly to a method and apparatus for enhancing system performance and reliability by controlling the operating temperature of each transistor.

BACKGROUND OF THE INVENTION

It is well known that the overall performance (including longevity and/or reliability) of electronic systems can be adversely affected if component operating temperatures are permitted to rise above certain rated values. Thus, systems utilizing large transistor arrays frequently incorporate cooling subsystems which monitor array operating temperatures and act to cool the array by, for example, increasing coolant flow rate. Although such cooling subsystems typically enhance system performance, they generally fail to rapidly respond to localized temperature excursions of individual transistors which can produce "hot spots" and lead to thermal runaway with potentially catastrophic failure. Thus, the functionality of an entire transistor array can be significantly compromised as a consequence of a single transistor experiencing an excessive junction temperature excursion.

SUMMARY OF THE INVENTION

The present invention is directed to a method and apparatus for use with a transistor array for enhancing the array's performance and/or reliability and/or longevity by sensing the temperature of each transistor in the array and initiating corrective action to maintain its temperature within a desired operating range.

In accordance with the invention, each of a plurality of array transistors has a temperature sensor closely thermally coupled thereto, preferably mounted within the transistor package, in close physical proximity to the transistor junction.

In a preferred embodiment, each temperature sensor is configured to supply digital output signals representing the junction temperature of a single transistor. The output signals are supplied to a digital controller which is connected in a feedback loop to control one or more parameters affecting the temperature producing behavior of each transistor. More particularly, a controllable temperature modifying device is coupled to each transistor and is controlled by the digital controller to maintain junction temperature within a specified range. Each such temperature modifying device can control one or more parameters; e.g., the magnitude of the drive current and/or supply voltage applied to the transistor and/or the flow rate of coolant provided to the transistor.

DETAILED DESCRIPTION

Figure 1:
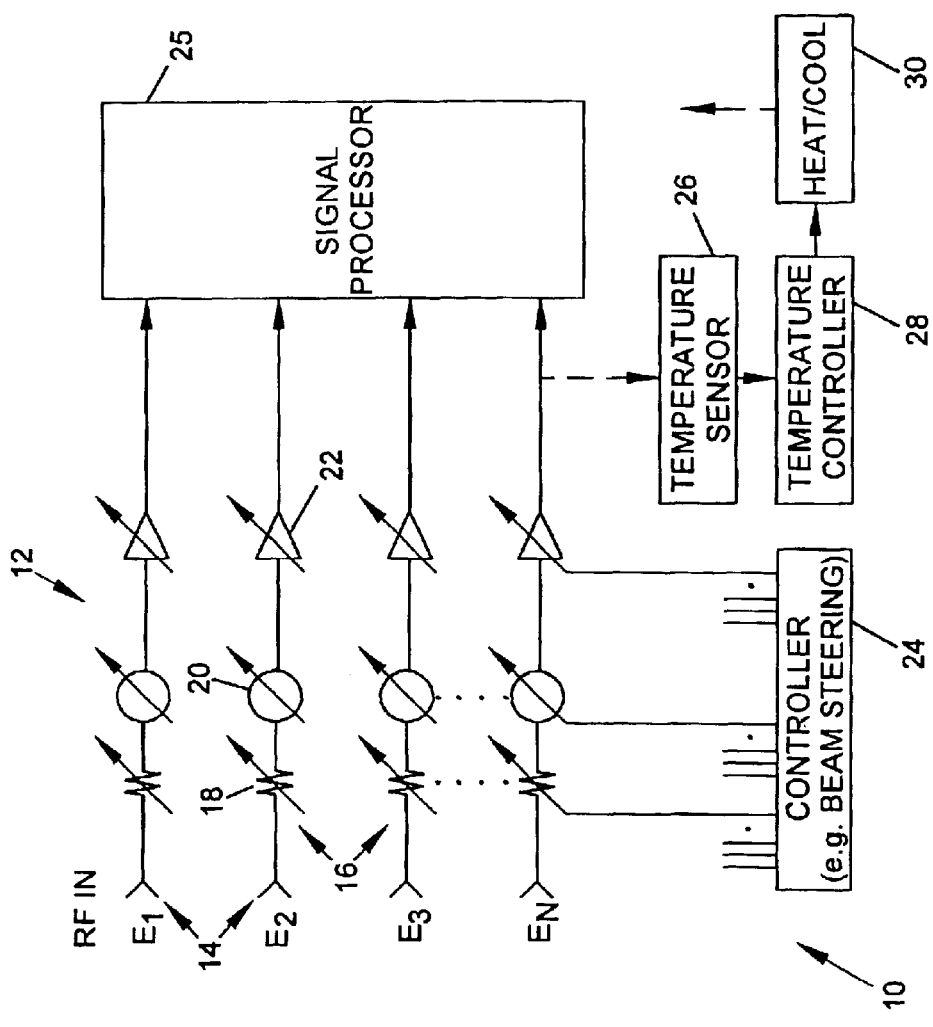
FIG. 1 is a schematic diagram of an exemplary prior art electronic system including an array of RF power transistors.

Attention is initially directed to FIG. 1 which schematically illustrates a portion of an exemplary prior art RF system 10 used, for example, for communications or radar surveillance. The system 10 typically includes an array 12 of RF transmit/receive (T/R) elements 14. Each element 14 is shown coupled to a dedicated circuit module 16 which typically includes multiple components such a variable impedance 18, a variable phase shifter 20, and a variable gain amplifier 22. The variable components 18, 20, 22 are typically controlled by a controller 24 which can be manually and/or algorithmically controlled to affect, for example, beam steering, RF signal optimization, etc. Each module 16 is shown coupled to a common signal processor 25 Each amplifier 22 is typically comprised of one or more transistors which can be of various types, e.g., Bipolar Junction (silicon), Gallium Arsenide, Silicon Carbide, Gallium Nitride, etc.

Systems of the type represented in FIG. 1 (e.g., radar systems) can employ upwards of a thousand modules, any one of which could experience a potentially damaging transistor temperature excursion. A consequence of such an excursion is a reduction in the useful life of the array inasmuch as individual transistors experiencing large temperature excursions are at increased risk of failure. Moreover, such temperature excursions can significantly degrade system performance. For example, in an active radar system, patches of non-functioning or poorly functioning modules are likely to lead to degraded sidelobes and reduced gain. Typically, failed modules tend to raise overall sidelobe levels of an active radar array and degrade angular beam pointing accuracy. In order to enhance array reliability and longevity, prior art systems typically utilize some type of sensor 26 for measuring the array temperature and a controller 28 responsive to the measured temperature for controlling a heating/cooling mechanism 30 to raise or lower the temperature of the entire array.

The present invention recognizes that even if the array operating temperature is properly maintained, individual transistors within the array can malfunction leading to elevated junction temperatures which can reduce system reliability and longevity. More particularly, if a transistor's junction temperature is permitted to rise considerably above its optimum operating value (which shall hereinafter be assumed to be about 150° C.), the transistor can develop a thermal runaway condition (e.g., to a junction temperature approaching 350° C.), thus damaging the transistor and reducing the performance of the entire array 12. Thus, it is important to recognize that even if the overall temperature of the array 12 is cooled to a proper level, local hot spots can degrade the performance and operating longevity of the entire system 10. The present invention is primarily directed to means for reducing the occurrence of transistor hot spots in order to enhance overall system performance and operational longevity.

Figure 2:
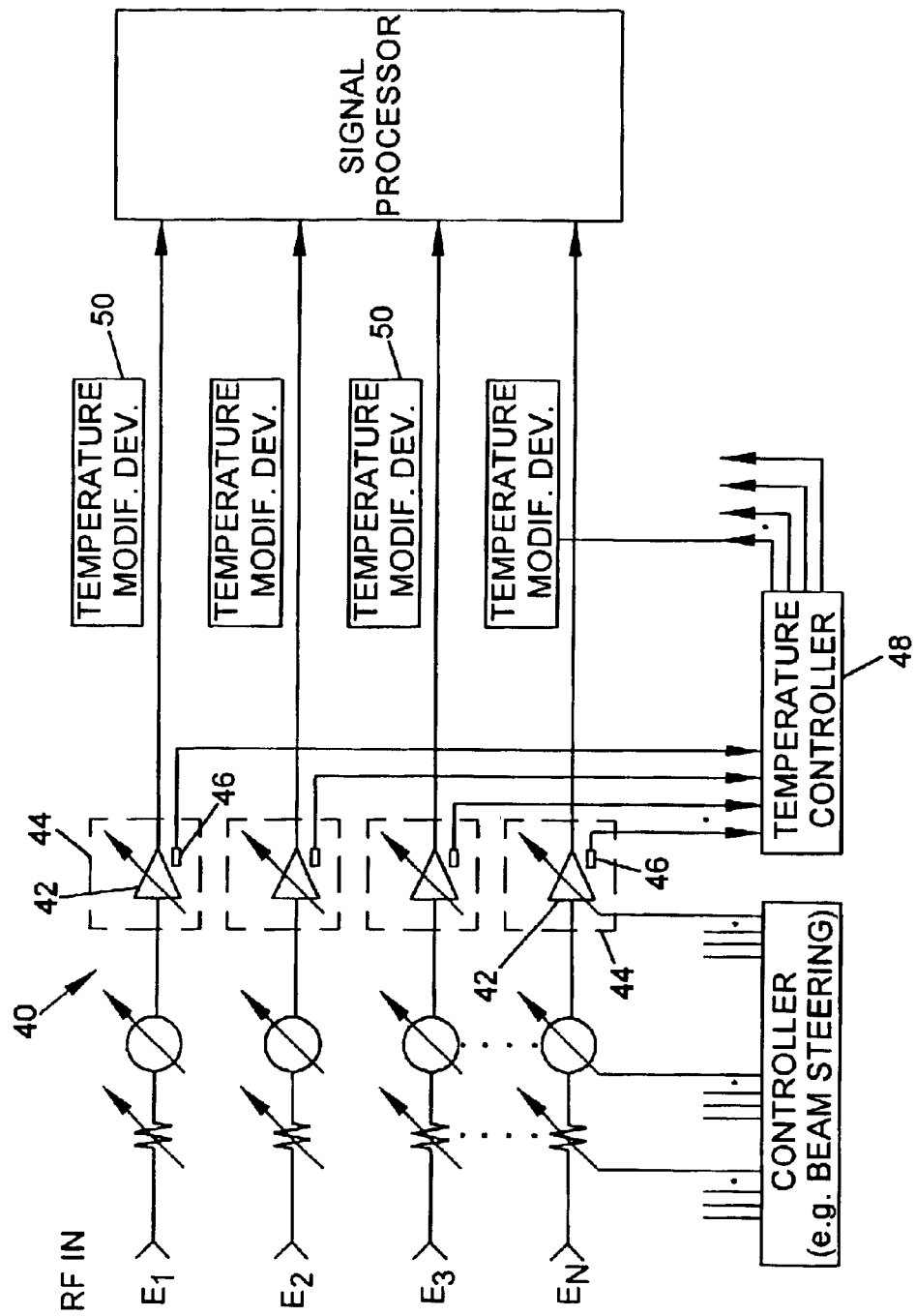
FIG. 2 is a schematic diagram of an exemplary system incorporating a temperature control subsystem in accordance with the invention for eliminating hot spots attributable to temperature excursions of individual transistors.

Attention is now directed to FIG. 2 which depicts the system of FIG. 1 modified in accordance with the invention to enhance system operational reliability and longevity. In accordance with the invention, the temperature of each transistor in the array 40 is separately monitored and utilized by a feedback loop to maintain the transistor's junction temperature within prescribed limits, e.g., 150° C.±10°.

For simplicity in illustration, FIG. 2 depicts an array 40 of amplifiers 42 where each amplifier 42 will be assumed to comprise an RF power transistor contained in a transistor package 44. In accordance with a preferred embodiment, each transistor package 44 also contains a separate temperature sensor 46 mounted so as to be closely thermally coupled to the junction of the transistor therein. An exemplary temperature sensor 46 suitable for mounting in the transistor package 44 comprises a small die (e.g., 50 by 60 mil.) which is available as an Analog Devices Serial Digital Output Thermometer TMP03/TMP04. To avoid calibration errors, spacing between each sensor and its associated transistor junction should be minimized. Temperature calibration is preferably performed using a reference infrared sensor (not shown) to read junction temperature. In operation, the sensed junction temperature is employed in a feedback loop (FIG. 3) to control a temperature modifying device 50 to maintain the junction temperature within a prescribed window, e.g., 150° C.±10°. A temperature modifying device in accordance with the invention functions to modify the temperature of a transistor in one or more of multiple ways, e.g., 1) by varying the magnitude of electrical energy delivered to the transistor, and/or 2) by active cooling using either liquid coolant circulating through a coldplate or forced-air directed by high speed blower.

Note in FIG. 2 that each of a plurality of transistors 42 in the array 40 is thermally coupled to a different one of a plurality of temperature sensors 46, each of the sensors preferably being mounted in the package 44 of the transistor. Each sensor preferably provides a digital output signal representing the temperature of the junction of the transistor thermally coupled thereto. The digital output signals from all of the sensors 46 are applied to the input of a digital temperature controller 48. The controller 48 is preferably a microprocessor based device which functions to determine whether the temperature of each transistor is within prescribed limits and based thereon generates control signals for controlling a plurality of temperature modifying devices 50. Each device 50 is configured to adjust the temperature of a different one of the plurality of transistors. Thus, the temperature of each transistor is effectively controlled by a dedicated feedback loop comprised of a related temperature sensor 46, the temperature controller 48, and an associated temperature modifying device 50. That is, each temperature sensor 46 and associated modifying device 50 defines a functionally distinct feedback loop including the temperature controller 48 which is preferably common to and time shared amongst the plurality of loops. The temperature controller 48 can be algorithmically or manually programmed to introduce a desired transfer function for responding to the output signals from sensors 46 for controlling the respective modifying devices 50.

Figure 3:
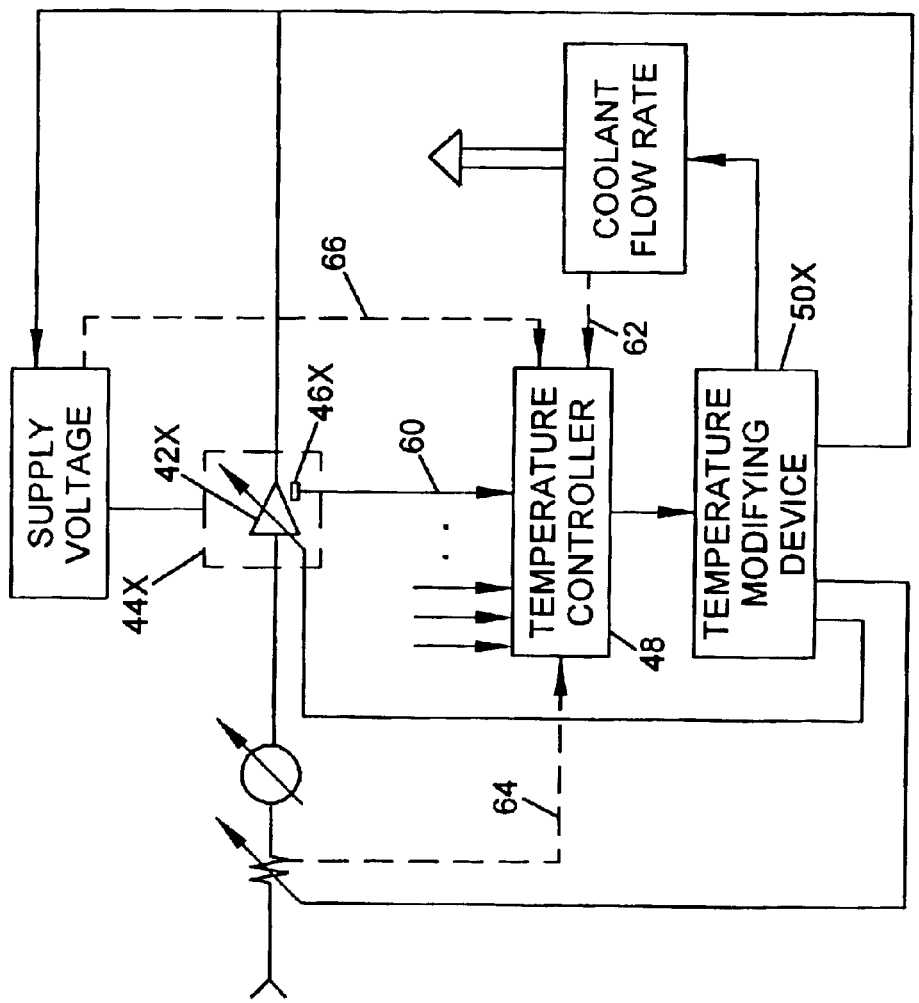
FIG. 3 is a schematic block diagram showing a portion of a temperature control subsystem in accordance with the invention including a temperature sensor mounted to sense the junction temperature of a transistor and connected to a controller in a feedback loop for controlling the junction temperature of the transistor.

FIG. 3 depicts, as an example, the feedback loop coupling a single exemplary temperature sensor 46X to a temperature modifying device 50X Inputs to the feedback loop controller 48 include, in addition to the temperature sensor output 60, the present coolant flow rate 62, the drive signal impedance level 64 and the supply voltage level 66.

Each feedback loop operates such that when a transistor is too hot, its related temperature modifying device 50 operates to modify the transistor's temperature generating parameters. Thus the modifying device 50 can operate to reduce the drive signal and/or supply voltage applied to the transistor to reduce the electrical energy dissipated therein and/or increase the flow rate of coolant to the transistor. On the other hand, when the transistor is too cool, the supplied electrical energy can be increased and/or the coolant flow rate decreased.

In a typical active radar systems, a temperature control subsystem in accordance with the invention can be employed to assure:

1. Correct two-dimensional aperture tapering for a low sidelobe distribution.
2. Accurate two-dimensional antenna pointing angles.
3. Optimized operation in situations of transistor failure which are removed from service. This involves algorithms to optimize gain, sidelobe and pointing performance for an array containing both operating and failed T/R modules.

From the foregoing, it should now be appreciated that a temperature control subsystem has been disclosed herein for controlling temperature excursions of individual transistors in an array of RF power transistors to enhance system performance and reliability. Although the invention has been described with reference to a specific preferred embodiment, it is recognized that various alternative implementations and modifications will readily occur to those skilled in the art which fall within the spirit of the invention and the intended scope of the appended claims.

What is claimed is:

1. A temperature control system for use in combination with an array of multiple power transistors, said system comprising:

a plurality of temperatures sensors;

each of said temperature sensors being closely thermally coupled to a different one of said transistors for producing an output signal indicative of the temperature thereof; and controller means for monitoring each of said output signals for maintaining the temperature of each of said transistors within a predefined range, said controller means including a digital controller responsive to said output signals and a temperature modifying means for selectively modifying the temperature of each of said transistors.

2. The system of claim 1 wherein each of said temperature sensors produces a digital output signal.

3. The system of claim 1 wherein each of said transistors is contained within a transistor package; and wherein each of said temperature sensors is mounted within a different transistor package.

4. The system of claim 1 wherein said temperature modifying means comprises means for controlling coolant flow to each of said transistors.

5. The system of claim 1 wherein said temperature modifying means comprises means for controlling electrical energy supplied to each of said transistors.

6. In combination with an electronic system including a plurality of RF power transistors, a subsystem for maintaining the junction temperature of each of said transistors within a specified temperature range, said subsystem comprising:

a plurality of temperature sensors each located to be closely thermally coupled to a different one of said transistors;

each of said temperature sensors being operable to produce an output signal representative of the junction temperature of the transistor thermally coupled thereto;

a plurality of controllable temperature modifying devices respectively associated with said plurality of transistors; and a controller responsive to said sensor output signals for controlling said temperature modifying devices to maintain the junction temperature of said transistors within a specified temperature range.

7. The combination of claim 6 wherein each of said temperature sensors is operable to produce a digital output signal.

8. The combination of claim 6 wherein each of said temperature modifying devices comprises a means for controlling coolant flow to one of said transistors.

9. The combination of claim 6 wherein each of said temperature modifying devices comprises a means for varying an electric signal supplied to one of said transistors.

10. A method of enhancing the reliability of an array comprised of a plurality of RF power transistors, said method including the steps of:

providing a plurality of temperature sensors each operable to produce an output signal indicative of the temperature thereat;

thermally coupling each of said sensors to a different one of said transistors;

monitoring the output signals produced by said sensors; and controlling a temperature modifying means for maintaining the temperature of each of said transistors within a defined range.

11. The method of claim 10 wherein said sensors provide digital output signals.

12. The method of claim 10 wherein each of said transistors is contained in a package; and each of said sensors is mounted in a different package and thermally coupled to the transistor therein.

13. The method of claim 10 wherein said step of controlling a temperature modifying means includes controlling a plurality of temperature modifying devices each associated with a different one of said transistors.

* * * * *